(12) United States Patent
Pagaila et al.

(10) Patent No.: US 8,334,171 B2
(45) Date of Patent: Dec. 18, 2012

(54) PACKAGE SYSTEM WITH A SHIELDED INVERTED INTERNAL STACKING MODULE AND METHOD OF MANUFACTURE THEREOF

(75) Inventors: Reza Argenty Pagaila, Singapore (SG); Zigmund Ramirez Camacho, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 72 days.

(21) Appl. No.: 12/629,877

(22) Filed: Dec. 2, 2009

(65) Prior Publication Data

US 2011/0127653 A1   Jun. 2, 2011

(51) Int. Cl.
*H01L 21/00* (2006.01)
(52) U.S. Cl. ... 438/109; 257/359; 257/686; 257/E23.13; 257/E23.114; 257/E25.013
(58) Field of Classification Search ............... 438/109; 257/659, 686, E25.013, E23.085, E23.13, 257/E23.114
See application file for complete search history.

(56) References Cited

U.S. PATENT DOCUMENTS

| | | | |
|---|---|---|---|
| 6,297,551 B1 * | 10/2001 | Dudderar et al. | 257/723 |
| 6,707,168 B1 * | 3/2004 | Hoffman et al. | 257/796 |
| 6,838,748 B2 * | 1/2005 | Ishio et al. | 257/659 |
| 6,838,761 B2 | 1/2005 | Karnezos | |
| 6,933,598 B2 * | 8/2005 | Karnezos | 257/686 |
| 7,187,060 B2 | 3/2007 | Usui | |
| 7,537,962 B2 | 5/2009 | Jang et al. | |
| 7,582,960 B2 | 9/2009 | Karnezos | |
| 7,808,087 B2 * | 10/2010 | Zhao et al. | 257/670 |
| 8,058,715 B1 * | 11/2011 | Roa et al. | 257/686 |
| 2008/0029866 A1 * | 2/2008 | Kim et al. | 257/686 |
| 2008/0142941 A1 * | 6/2008 | Yew et al. | 257/686 |
| 2008/0150093 A1 * | 6/2008 | Jang et al. | 257/659 |
| 2009/0085199 A1 | 4/2009 | Yoon et al. | |
| 2009/0194867 A1 | 8/2009 | Lee et al. | |

* cited by examiner

*Primary Examiner* — John C Ingham
(74) *Attorney, Agent, or Firm* — Ishimaru & Associates LLP; Mikio Ishimaru; Stanley M. Chang (57) ABSTRACT

A method of manufacture of a package system includes: providing a base package substrate having conductive elements; providing an internal stacking module having a semiconductor die mounted on a package substrate and a first encapsulant surrounding at least portions of the semiconductor die and the package substrate; covering at least portions of the first encapsulant in the internal stacking module with an electromagnetic interference shield, the electromagnetic interference shield shaped to have an outside face; mounting the internal stacking module over the base package substrate with the outside face of the electromagnetic interference shield facing the base package substrate; and encapsulating at least portions of the internal stacking module, the electromagnetic interference shield, and the base package substrate using a second encapsulant.

20 Claims, 6 Drawing Sheets

PACKAGE SYSTEM WITH A SHIELDED INVERTED INTERNAL STACKING MODULE AND METHOD OF MANUFACTURE THEREOF

TECHNICAL FIELD

The present invention relates generally to an integrated circuit packaging system, and more particularly to a packaging system incorporating an internal stacking module.

BACKGROUND ART

Consumers continue to demand higher performance and lower cost electronic products incorporating an increasing number of features. These market demands have resulted in increased miniaturization of components and greater packaging density of integrated circuits ("IC's"). The increasing functionality and decreasing size and number of system components make IC's increasingly susceptible to damage during manufacturing and in use. Integrated circuit packages are commonly used to encase the IC and provides protection and electrical connectivity to external circuitry and components.

IC devices—also known as semiconductor dies—are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. In order to interface a die with other circuitry, it is common to mount it on a leadframe or on a multi-chip module base leadframe that is surrounded by a number of lead fingers. Each die has bonding pads that are then individually connected in a wire-bonding operation to the leadframe's lead finger pads using extremely fine gold or aluminum wires. The assemblies are then packaged by individually encapsulating them in molded plastic or ceramic bodies.

IC packaging technology has shown an increase in semiconductor chip density (the number of chips mounted on a single circuit board or base leadframe) that parallels the reduction in the number of components that are needed for a circuit. This results in packaging designs that are more compact, in form factors (the physical size and shape of a device) that are more compact, and in a significant increase in overall IC density. However, IC density continues to be limited by the space (or "real estate") available for mounting individual die on a base leadframe.

To condense further the packaging of individual devices, packages have been developed in which more than one device can be packaged at one time at each package site. Each package site is a structure that provides mechanical support for the individual IC devices. It also provides one or more layers of interconnect lines that enable the devices to be connected electrically to surrounding circuitry. Of importance to complicated packaging designs are considerations of input/output count, heat dissipation, matching of thermal expansion between a motherboard and its attached components, cost of manufacturing, ease of integration into an automated manufacturing facility, package reliability, and easy adaptability of the package to additional packaging interfaces such as a printed circuit board ("PCB").

In some cases, multi-chip devices can be fabricated faster and more cheaply than a corresponding single IC chip, that incorporates all the same functions. Current multi-chip modules typically consist of a PCB base package substrate onto which a set of separate IC chip components is directly attached. Such multi-chip modules have been found to increase circuit density and miniaturization, improve signal propagation speed, reduce overall device size and weight, improve performance, and lower costs—all primary goals of the computer industry.

However, such multi-chip modules can be bulky. IC package density is determined by the area required to mount a die or module on a circuit board. One method for reducing the board size of multi-chip modules and thereby increase their effective density is to stack the die or chips vertically within the module or package.

Such designs are improvements over prior multi-chip package and system-in-a-package ("SiP") designs that combined several semiconductor die and associated passive components ("passives") side by side in a single, horizontal layer. Combining them into a single horizontal layer used board space inefficiently by consuming large base package substrate areas, and afforded less advantage in circuit miniaturization.

However, multi-chip modules, whether vertically or horizontally arranged, can also present problems because they usually must be assembled before the component chips and chip connections can be tested. That is, because the electrical bond pads on a die are so small, it is difficult to test die before assembly onto a base package substrate. Thus, when die are mounted and connected individually, the die and connections can be tested individually, and only known-good-die ("KGD") free of defects are then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process problems including yield.

An Internal Stacking Module (ISM) is a package component that includes a packaged IC circuit and that can be assembled into a larger multi-chip package. Internal stacking modules can be pre-tested prior to assembly into a larger package, and therefore can be sorted as Known Good Packages (KGP) prior to assembly into a larger multi-chip package.

Semiconductor dies containing integrated circuits need to be protected from external sources of electromagnetic radiation that may impact circuit operation. To prevent electromagnetic interference, groups of packaged semiconductor devices may be placed in a module or box. The module shields the semiconductor devices from electromagnetic interference (EMI). Even though a shielded module may provide overall EMI protection from outside interference, semiconductor devices inside the module can still interfere with each other.

Given the increased functionality of new electronic products such as advanced cell phones, there is a need for semiconductor packages that include features for shielding semiconductor dies from electromagnetic interference. Such functionality enables placing EMI-sensitive components in the proximity of sources of electromagnetic radiation.

The main issues with existing shielding approaches are the lack of lateral shielding of the semiconductor die and lack of an effective and reliable approach for connecting the shield to a ground loop using the least number of lead connections.

Despite the advantages of recent developments in semiconductor fabrication and packaging techniques, there is a continuing need for improved packaging methods, systems, and designs for increasing semiconductor die density in PCB assemblies that include components with added electromagnetic interference shielding.

In view of the increasing requirements for multi-chip packages with effective EMI shielding, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a package system including: providing a base package substrate having conductive elements; providing an internal stacking module having a semiconductor die mounted on a package substrate and a first encapsulant surrounding at least portions of the semiconductor die and the package substrate; covering at least portions of the first encapsulant in the internal stacking module with an electromagnetic interference shield, the electromagnetic interference shield shaped to have an outside face; mounting the internal stacking module over the base package substrate with the outside face of the electromagnetic interference shield facing the base package substrate; and encapsulating at least portions of the internal stacking module, the electromagnetic interference shield, and the base package substrate using a second encapsulant.

In addition, the present invention provides a package system, including: a base package substrate having conductive elements; an internal stacking module having a semiconductor die mounted on a package substrate and a first encapsulant surrounding at least portions of the semiconductor die and the package substrate; an electromagnetic interference shield shaped to have an outside face covering at least portions of the first encapsulant in the internal stacking module; with the outside face of the electromagnetic interference shield facing the base package substrate; and a second encapsulant encapsulating at least portions of the internal stacking module, the electromagnetic interference shield, and the base package substrate.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Figure 1:
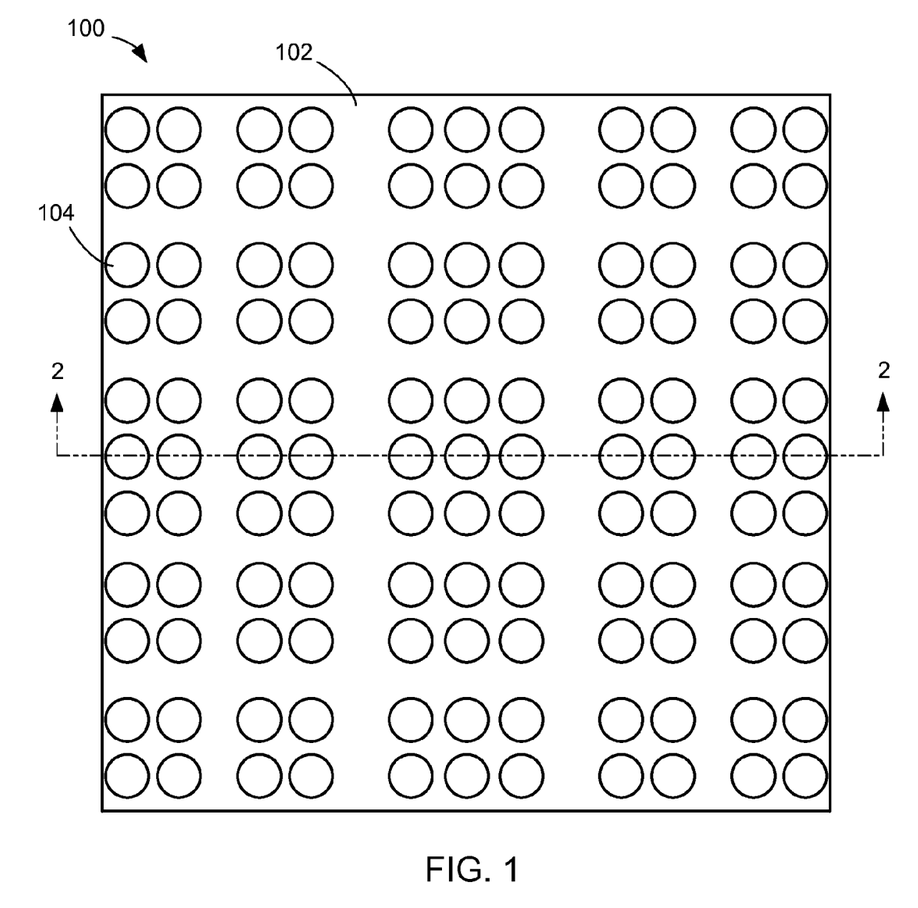
FIG. 1 is a bottom plan view of a package system in a first embodiment of the present invention.

Referring now to FIG. 1, therein is shown a bottom plan view of a package system 100 in a first embodiment of the present invention. In the bottom plan view only a base package substrate 102 is visible. The base package substrate is made of an insulating material and contains conductive elements 104 such as contact pads, connecting lines, and through vias.

Figure 2:
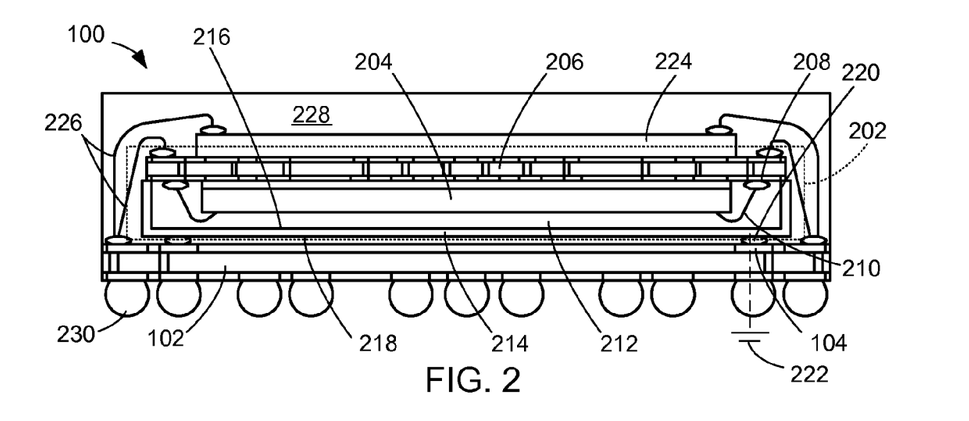
FIG. 2 is a cross-sectional view of the package system taken along line 2-2 in FIG. 1.

Referring now to FIG. 2, therein is shown a cross-sectional view of the package system 100 taken along line 2-2 in FIG. 1. The package system 100 includes an internal stacking module 202 having a semiconductor die 204 attached to a package substrate 206. The semiconductor die 204 is electrically connected to conductive elements 208 in the package substrate 206 using interconnects 210 such as wire bonds. At least portions of the semiconductor die 204, the package substrate 206, and the interconnects are encapsulated using a first encapsulant 212.

The exposed regions of the first encapsulant 212 in the internal stacking module 202 are covered with an electromagnetic interference shield 214, which isolates the semiconductor die 204 from electromagnetic interference generated within or outside the package system 100. The electromagnetic interference shield 214 has an inside face 216 touching the first encapsulant 212 and an outside face 218 facing elements external to the internal stacking module 202. The electromagnetic interference shield 214 is attached to the first encapsulant 212 and completely covers each vertical side of the first encapsulant 212 and completely covers a side of the first encapsulant 212 opposite of the package substrate 206. The electromagnetic interference shield 214 is structurally isolated from a vertical side of the package substrate 206.

The electromagnetic interference shield 214 is an electrically and thermally conducting layer, and in addition from shielding electromagnetic radiation, it acts as a heat distributor and thus helps minimize warping of the internal stacking module 202 during fabrication or assembly of the package system 100.

The internal stacking module 202 is mounted inverted over the base package substrate 102 with the outside face 218 of the electromagnetic interference shield 214 facing the base package substrate 102. The electromagnetic interference shield 214 is connected to the conductive elements 104 on the surface of the base package substrate 102 using interconnects 220 such as solder balls, solder bumps or conductive epoxy bumps. The conductive elements are in turn connected to a ground 222 outside the package system 100.

A second semiconductor die 224 is attached to the exposed surface of the package substrate 206 of the internal stacking module 202. The second semiconductor die 224 and the package substrate 206 are connected to the base package substrate 102 using interconnects 226 such as bond wires. A second encapsulant 228 encloses at least portions of the base package substrate 102, the internal stacking module 202, the electromagnetic interference shield 214, and the interconnects 226. External interconnects 230 provide connectivity to the next system level.

It has been discovered that the package system 100 of the present invention reduces the length of the path to the ground 222 between the electromagnetic interference shield 214 and the base package substrate 102 by placing the internal stacking module 202 with the electromagnetic interference shield 214 connected on top of the conductive elements 104 in the base package 102 using the interconnects 220.

In addition, it has been unexpectedly found that by connecting the electromagnetic interference shield 214 directly to the base package substrate 102 reduces the required size of the internal stacking module 202, since no additional area is needed for periphery contacts for connecting the electromagnetic interference shield 214 to a path to the ground 222.

Further it has been unexpectedly determined that the conductive elements 104 directly facing the electromagnetic interference shield 214 may be expanded in size up to the overall area of the internal stacking module 202, expanding the shielding capability of the package system 100.

It has also been unexpectedly found that the electromagnetic interference radiation shield 214 has heat-spreading capabilities that minimize warping of the internal stacking module 202 during heat cycles present in the packaging process, providing greater overall reliability of the package system 100.

Thus, it has been discovered that the package system 100 of the present invention furnishes improved shielding of electromagnetic interference radiation while providing a compact package with improved reliability.

Figure 3:
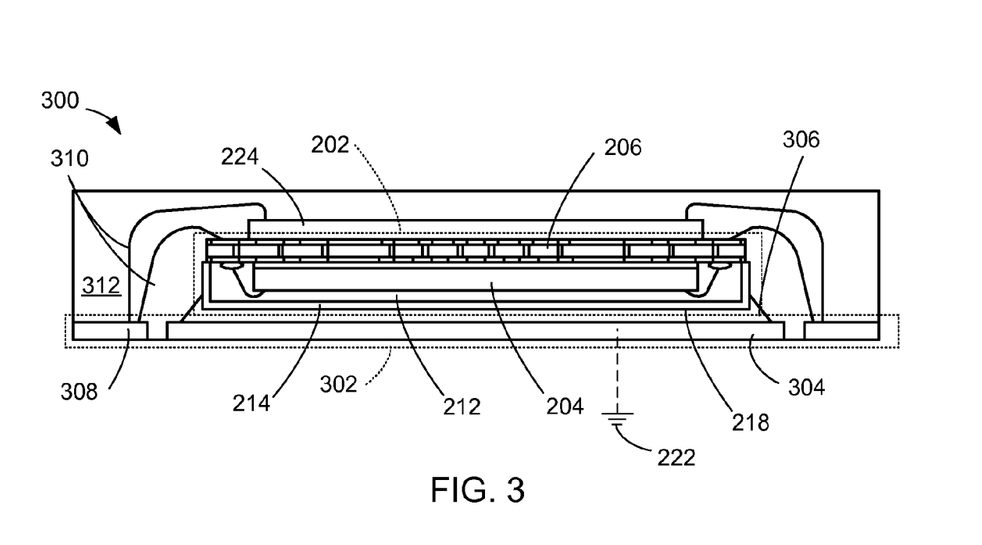
FIG. 3 is a cross-sectional view of a package system in a second embodiment of the present invention.

Referring now to FIG. 3, therein is shown a cross-sectional view of a package system 300 in a second embodiment of the present invention. Similar to the package system 100 of FIG. 1, the package system 300 incorporates the internal stacking module 202 with an electromagnetic interference shield 214 covering exposed regions of the first encapsulant 212. The electromagnetic interference shield 214, isolates the semiconductor die 204 from electromagnetic interference generated within or outside the package system 300.

The internal stacking module 202 is mounted inverted over a leadframe 302, which replaces the base package substrate 102 in the package system 100 shown in FIG. 1. The outside face 218 of the electromagnetic interference shield 214 is attached to a die paddle 304 in the leadframe 302 using a conductive layer 306 such as solder or conductive epoxy paste. The die paddle 304, which is made of a conductive material, is in turn connected to the ground 222 outside the package system 300.

The second semiconductor die 224 is attached to the exposed surface of the package substrate 206 of the internal stacking module 202. The second semiconductor die 224 and the package substrate 206 are connected to a lead 308 in the leadframe using interconnects 310 such as bond wires. A second encapsulant 312 encloses at least portions of the leadframe 302, the internal stacking module 202, the electromagnetic interference shield 214, and the interconnects 310.

Figure 4:
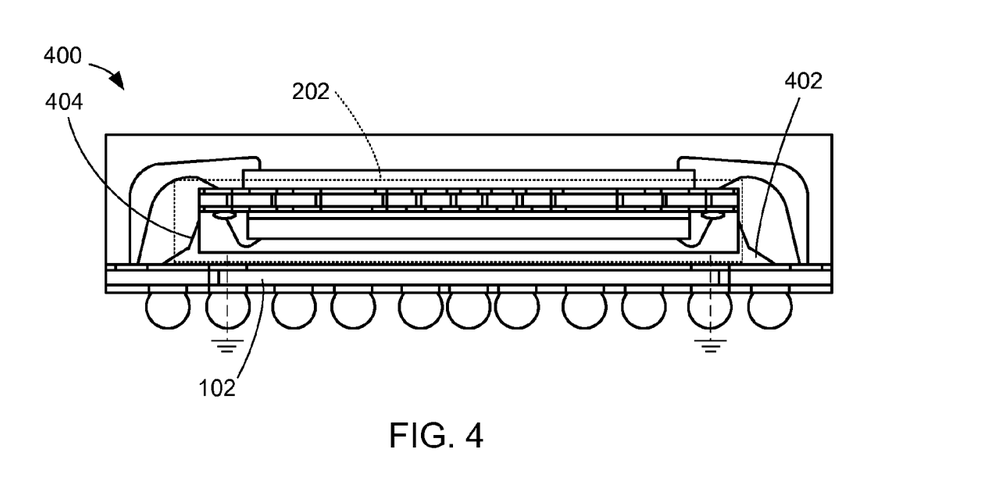
FIG. 4 is a cross-sectional view of a package system in a third embodiment of the present invention.

Referring now to FIG. 4, therein is shown a cross-sectional view of a package system 400 in a third embodiment of the present invention. The package system 400 incorporates the internal stacking module 202 attached to the base package substrate 102 using a conductive layer 402 with a fillet 404 configured to be cover the sides of the internal stacking module 202 high enough as to act as an electromagnetic interference shield.

It has been discovered that the conductive layer 402 with the fillet 404 provides appropriate electromagnetic interference shielding, making the conductive layer 402 an adequate replacement for the electromagnetic interference shield 214 of FIG. 1.

Figure 5:
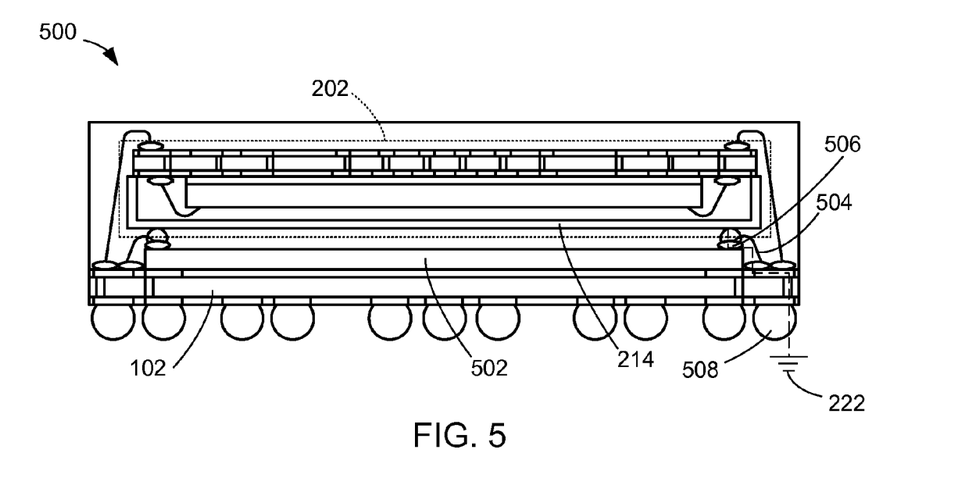
FIG. 5 is a cross-sectional view of a package system in a fourth embodiment of the present invention.

Referring now to FIG. 5, therein is shown a cross-sectional view of a package system 500 in a fourth embodiment of the present invention. The package system 500 includes a second semiconductor die 502 attached to the base package substrate 102 and the internal stacking module 202 mounted inverted over the second semiconductor die 502.

The electromagnetic interference shield 214, covering portions of the internal stacking module 202, is connected to the base package substrate 102 through an interconnect 504 and to the second semiconductor die 502 through a portion of the interconnect 504 and a conductive element 506 arranged on top of the second semiconductor die 502. In the preferred embodiment of the invention the interconnect 504 is a bond wire and the conductive element 506 is a ball or bump made of solder or conductive epoxy. The base package substrate 102 is connected to the ground 222 through an external interconnect 508.

Figure 6:
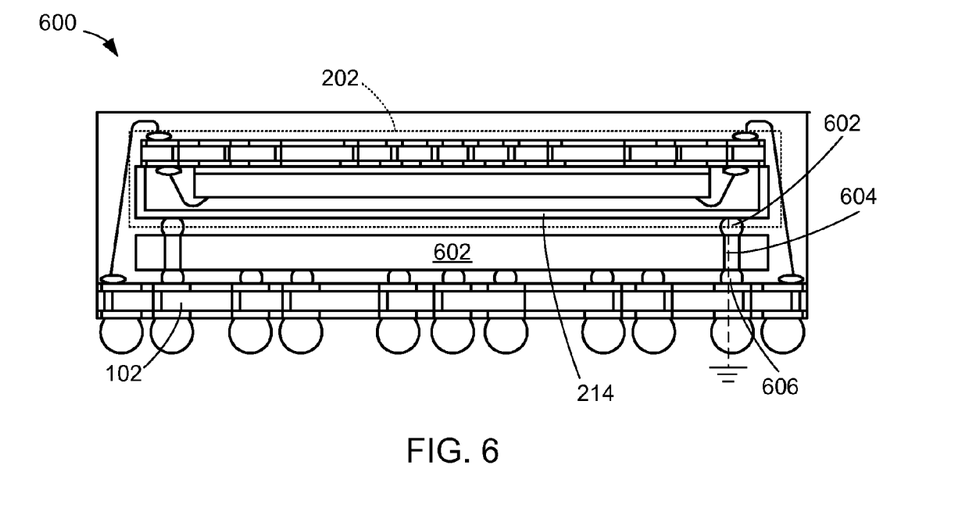
FIG. 6 is a cross-sectional view of a package system in a fifth embodiment of the present invention.

Referring now to FIG. 6, therein is shown a cross-sectional view of a package system 600 in a fifth embodiment of the present invention. The package system 600 includes a silicon interposer 602 attached to the base package substrate 102 and the internal stacking module 202 mounted inverted over the silicon interposer 602. In one embodiment of the invention, the silicon interposer 602 is a semiconductor die.

The electromagnetic interference shield 214, covering portions of the internal stacking module 202, is connected to the base package substrate 102 using a through silicon via 604 and an interconnect 606 such as a ball or bump made of solder or conductive epoxy. The through silicon via 604 is a conductive element connecting through the silicon interposer 602.

Figure 7:
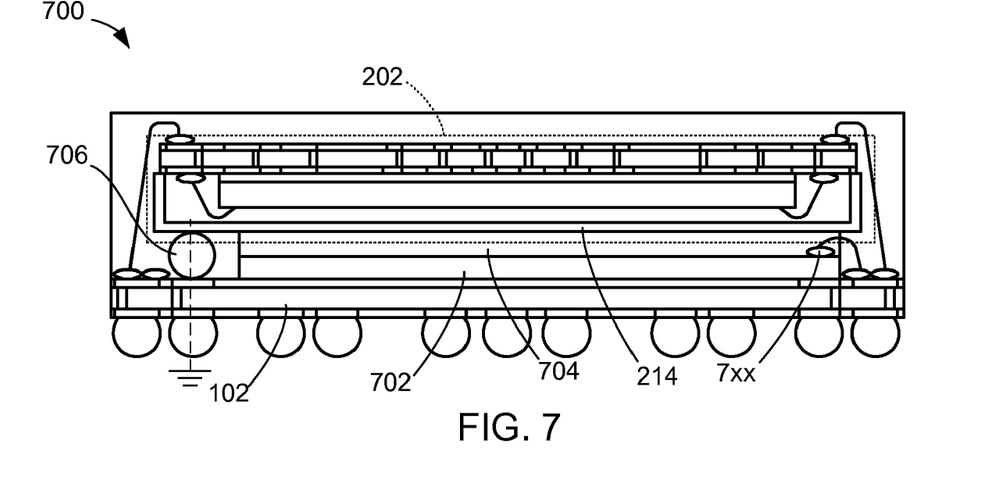
FIG. 7 is a cross-sectional view of a package system in a sixth embodiment of the present invention.

Referring now to FIG. 7, therein is shown a cross-sectional view of a package system 700 in a sixth embodiment of the present invention. The package system 700 includes a second semiconductor die 702 mounted over the base package substrate 102 and the internal stacking module 202 mounted inverted over a wire in film adhesive 704 layered over the second semiconductor die 702.

The electromagnetic interference shield 214, covering portions of the internal stacking module 202, is connected directly to the base package substrate 102 using a conductive bridge 706 such as a conductive epoxy ball. The second semiconductor die 702 is offset-mounted, leaving a region underneath the internal stacking module 202 for the conductive bridge 706. Interconnects 708 such as bond wires connect the second semiconductor device 702 to the base package substrate 102.

Figure 8:
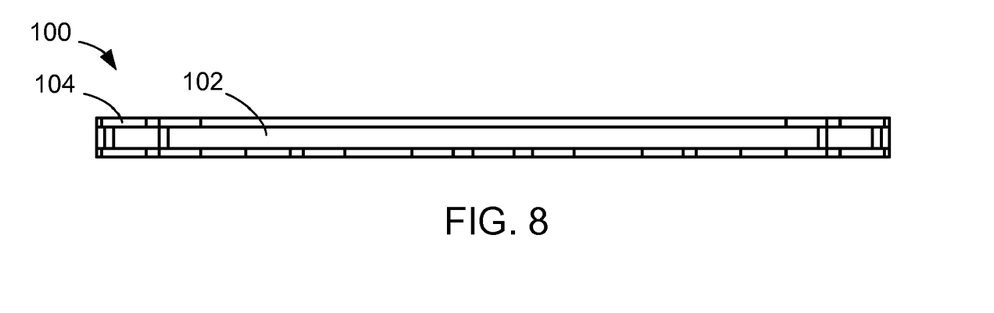
FIG. 8 is a cross-sectional view of the package system at the initial stage of manufacture.

Referring now to FIG. 8, therein is shown a cross-sectional view of the package system 100 at the initial stage of manufacture. The first step in the fabrication of the package system 100 is providing a package substrate with the conductive elements 104.

Figure 9:
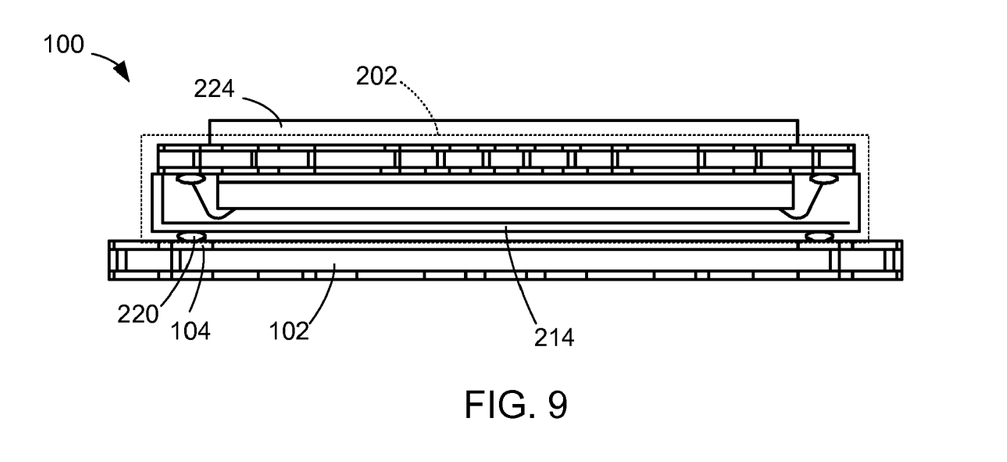
FIG. 9 is a cross-sectional view of the package system following attachment of the internal stacking module inverted over the base package substrate and attachment of the second semiconductor die over the internal stacking module.

Referring now to FIG. 9, therein is shown a cross-sectional view of the package system 100 following attachment of the internal stacking module 202 inverted over the base package substrate 102 and attachment of the second semiconductor die 224 over the internal stacking module 202. Prior to assembly, the internal stacking module 202 is coated with the electromagnetic interference shield 214 and preferably sorted electronically as a good known die. During the assembly process, the electromagnetic interference shield 214 is connected to the conductive elements 104 on the surface of the base package substrate 102 using interconnects 220 such as solder balls, solder bumps or conductive epoxy bumps.

Figure 10:
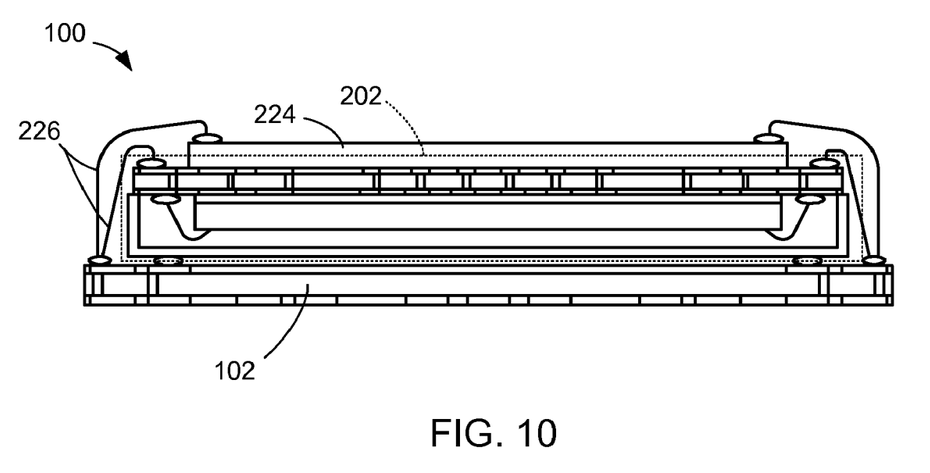
FIG. 10 is a cross-sectional view of the package system following placements of interconnects connecting the package substrate in the internal stacking module and the second semiconductor die to the base package substrate.

Referring now to FIG. 10, therein is shown a cross-sectional view of the package system 100 following placements of interconnects 226 connecting the package substrate 206 in the internal stacking module 202 and the second semiconductor die 224 to the base package substrate 102.

Figure 11:
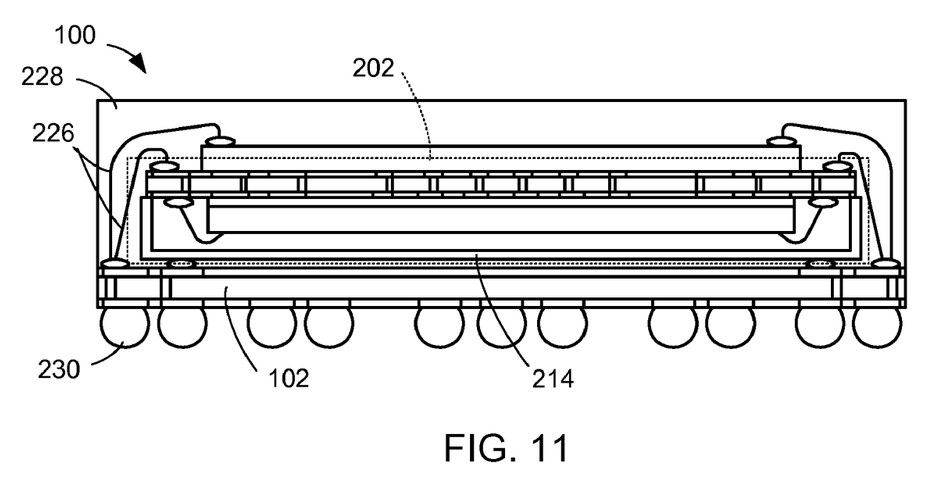
FIG. 11 is a cross-sectional view of the package system following encapsulation of at least portions of the base package substrate, the internal stacking module, the electromagnetic interference shield, and the interconnects using a second encapsulant.

Referring now to FIG. 11, therein is shown a cross-sectional view of the package system 100 following encapsulation of at least portions of the base package substrate 102, the internal stacking module 202, the electromagnetic interference shield 214, and the interconnects 226 using the second encapsulant 228. External interconnects 230 may be arranged on the bottom surface of the base package substrate 102 for connections to the next system level.

Figure 12:
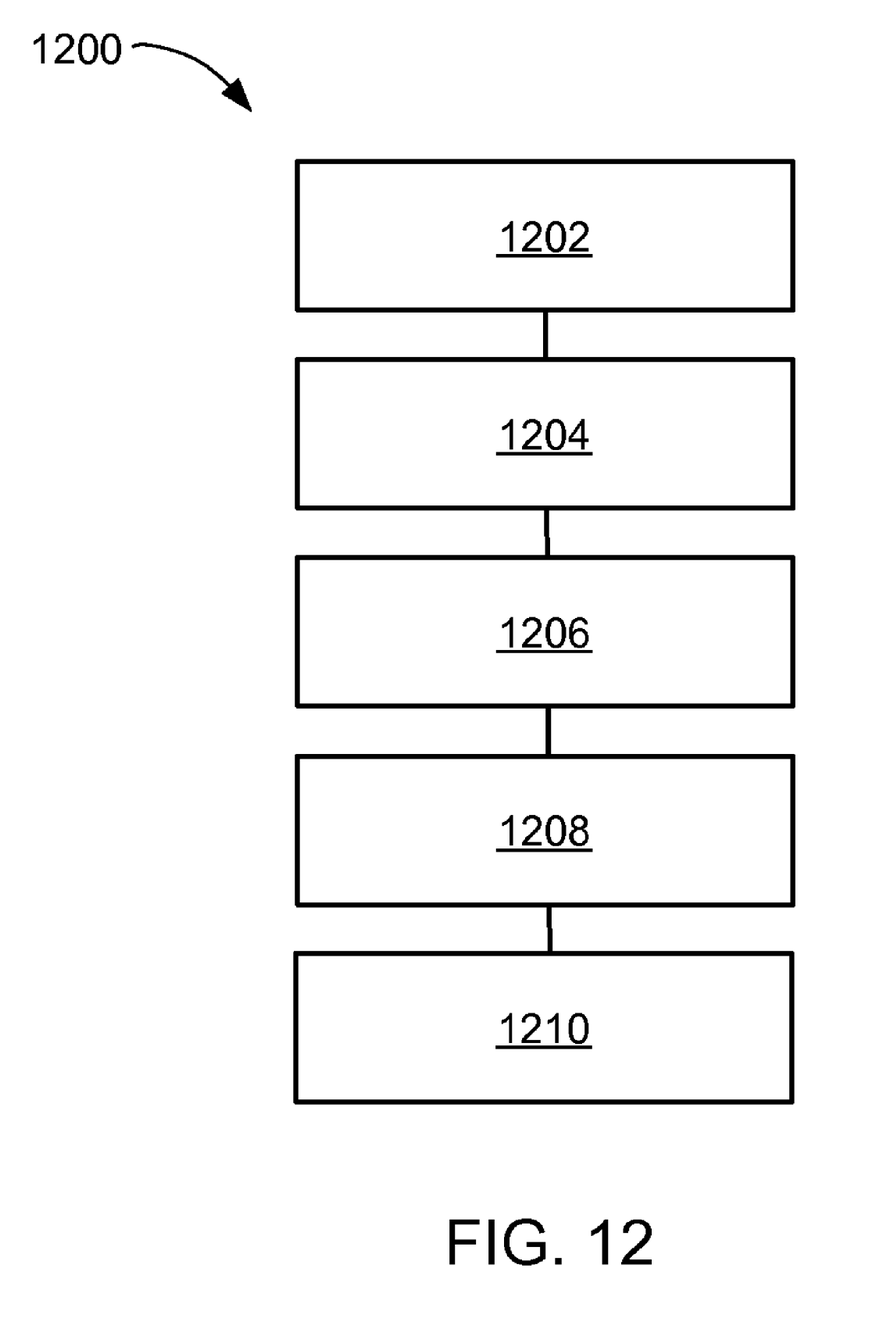
FIG. 12 is a flow chart of a method of manufacture of a package system in an embodiment of the present invention.

Referring now to FIG. 12, therein is shown a flow chart of a method 1200 of manufacture of the package system 100 in an embodiment of the present invention. The method 1200 includes: providing a base package substrate having conductive elements in a block 1202; providing an internal stacking module having a semiconductor die mounted on a package substrate and a first encapsulant surrounding at least portions of the semiconductor die and the package substrate in a block 1204; covering at least portions of the first encapsulant in the internal stacking module with an electromagnetic interference shield, the electromagnetic interference shield shaped to have an outside face in a block 1206; mounting the internal stacking module over the base package substrate with the outside face of the electromagnetic interference shield facing the base package substrate in a block 1208, and encapsulating at least portions of the internal stacking module, the electromagnetic interference shield, and the base package substrate using a second encapsulant in a block 1210.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a package system comprising:
   providing a base package substrate having conductive elements;
   providing an internal stacking module having a semiconductor die mounted on a package substrate and a first encapsulant surrounding at least portions of the semiconductor die and the package substrate;
   attaching an electromagnetic interference shield to the first encapsulant, the electromagnetic interference shield covering vertical sides of the first encapsulant and a side of the first encapsulant opposite the package substrate, the electromagnetic interference shield shaped to have an outside face and structurally isolated from a vertical side of the package substrate;
   mounting the internal stacking module over the base package substrate with the outside face of the electromagnetic interference shield facing the base package substrate; and
   encapsulating at least portions of the internal stacking module, the electromagnetic interference shield, and the base package substrate using a second encapsulant.

2. The method as claimed in claim 1 further comprising connecting the electromagnetic interference shield to the conductive elements in the base package substrate using interconnects arranged between the electromagnetic interference shield and the conductive elements in the base package substrate.

3. The method as claimed in claim 1 wherein the base package substrate is a leadframe having a die paddle, and further comprising connecting the outside face of the electromagnetic interference shield to the die paddle in the leadframe using a conductive layer.

4. The method as claimed in claim 1 wherein the electromagnetic interference shield is formed using a conductive layer with a fillet configured to cover the sides of the internal stacking module.

5. The method as claimed in claim 1 further comprising mounting a second semiconductor die on the package substrate.

6. A method of manufacture of a package system comprising:
providing a base package substrate having conductive elements;
providing an internal stacking module having a semiconductor die mounted on a package substrate and a first encapsulant surrounding at least portions of the semiconductor die and the package substrate;
attaching an electromagnetic interference shield to the first encapsulant, the electromagnetic interference shield covering vertical sides of the first encapsulant and a side of the first encapsulant opposite the package substrate, the electromagnetic interference shield shaped to have an outside face and structurally isolated from a vertical side of the package substrate;
mounting the internal stacking module over the base package substrate with the outside face of the electromagnetic interference shield facing the base package substrate;
mounting a second semiconductor die over the base package substrate; and
encapsulating at least portions of the internal stacking module, the electromagnetic interference shield, the second semiconductor die, and the base package substrate using a second encapsulant.

7. The method as claimed in claim 6 wherein the second semiconductor die is mounted over the package substrate.

8. The method as claimed in claim 6 wherein the second semiconductor die is mounted between the internal stacking module and the base package substrate.

9. The method as claimed in claim 6 wherein the second semiconductor die is a silicon interposer having a through silicon via placed between the internal stacking module and the base package substrate.

10. The method as claimed in claim 6 further comprising a conductive bridge connecting the electromagnetic interference shield to conductive elements in the base package substrate.

11. A package system comprising:
a base package substrate having conductive elements;
an internal stacking module having a semiconductor die mounted on a package substrate and a first encapsulant surrounding at least portions of the semiconductor die and the package substrate;
an electromagnetic interference shield covering vertical sides of the first encapsulant and a side of the first encapsulant opposite the package substrate, the electromagnetic interference shield structurally isolated from a vertical side of the package substrate and shaped to have an outside face covering the first encapsulant in the internal stacking module with the outside face of the electromagnetic interference shield facing the base package substrate; and
a second encapsulant encapsulating at least portions of the internal stacking module, the electromagnetic interference shield, and the base package substrate.

12. The system as claimed in claim 11 further comprising interconnects for connecting the electromagnetic interference shield to the conductive elements in the base package substrate.

13. The system as claimed in claim 11 wherein the base package substrate is a leadframe having a die paddle, and further comprising a conductive layer for connecting the electromagnetic interference shield to the die paddle in the leadframe.

14. The system as claimed in claim 11 wherein the electromagnetic interference shield is a conductive layer with a fillet configured to cover the sides of the internal stacking module.

15. The system as claimed in claim 11 further comprising a second semiconductor die mounted on the package substrate.

16. The system as claimed in claim 11 further comprising a second semiconductor die mounted over the base package substrate.

17. The system as claimed in claim 16 wherein the second semiconductor die is located over the package substrate.

18. The system as claimed in claim 16 wherein the second semiconductor die is placed between the internal stacking module and the base package substrate.

19. The system as claimed in claim 16 wherein the second semiconductor die is a silicon interposer having a through silicon via.

20. The system as claimed in claim 16 further comprising a conductive bridge for connecting the electromagnetic interference shield to the conductive elements in the base package substrate.

* * * * *